(12) United States Patent
Bass et al.

(10) Patent No.: US 6,591,403 B1
(45) Date of Patent: Jul. 8, 2003

(54) SYSTEM AND METHOD FOR SPECIFYING HARDWARE DESCRIPTION LANGUAGE ASSERTIONS TARGETING A DIVERSE SET OF VERIFICATION TOOLS

(75) Inventors: Bradley Forrest Bass, Carrollton, TX (US); Harry David Foster, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 41 days.

(21) Appl. No.: 09/677,352

(22) Filed: Oct. 2, 2000

(51) Int. Cl.$^7$ ................................................ G06F 17/50
(52) U.S. Cl. .................................. 716/5; 716/1; 716/18
(58) Field of Search ........................................ 716/5, 18

(56) References Cited

U.S. PATENT DOCUMENTS

| | | | | | |
|---|---|---|---|---|---|
| 5,197,016 | A | * | 3/1993 | Sugimoto et al. ............... | 716/8 |
| 5,493,507 | A | * | 2/1996 | Shinde et al. ................... | 703/14 |
| 5,499,192 | A | * | 3/1996 | Knapp et al. ................... | 716/17 |
| 5,751,592 | A | * | 5/1998 | Takai et al. ..................... | 716/5 |
| 5,784,593 | A | * | 7/1998 | Tseng et al. .................... | 703/15 |
| 5,841,663 | A | * | 11/1998 | Sharma et al. ................. | 716/18 |
| 5,883,814 | A | * | 3/1999 | Luk et al. ....................... | 716/2 |
| 5,896,521 | A | * | 4/1999 | Shackleford et al. .......... | 703/21 |
| 5,946,478 | A | * | 8/1999 | Lawman ......................... | 716/17 |
| 5,950,201 | A | * | 9/1999 | Van Huben et al. ........... | 707/10 |
| 5,987,239 | A | * | 11/1999 | Kirsch ............................ | 716/1 |
| 5,991,523 | A | * | 11/1999 | Williams et al. ............... | 716/18 |
| 6,120,550 | A | * | 9/2000 | Southgate et al. ............. | 716/11 |
| 6,135,647 | A | * | 10/2000 | Balakrishnan et al. ........ | 716/18 |
| 6,163,876 | A | * | 12/2000 | Ashar et al. .................... | 716/5 |
| 6,182,258 | B1 | * | 1/2001 | Hollander .................... | 714/739 |
| 6,226,776 | B1 | * | 5/2001 | Panchul et al. ................ | 716/3 |

OTHER PUBLICATIONS

Fatma A. El–Licy et al., Verification System Interface for VLSI Combinational Circuits, Circuits and Systems, 1998. Proceedings., pp. 408–411, Aug. 1998.*

Wayne Luk et al., Compilation Tools for Run–Time Reconfigurable Designs, The 5th Annual IEEE Symposium on. Proceedings of Field–Programmable Custom Computing Machines. pp. 56–65, Apr., 1997.*

Lionel Bening, A Two–State Methodology for RTL Logic Simulation, Proceedings of Design Automation Conference, pp. 672–677, Jun. 1999.*

(List continued on next page.)

Primary Examiner—Matthew Smith
Assistant Examiner—A. M. Thompson (57) ABSTRACT

A method, and system in support thereof, of specifying hardware description language assertions targeting a diverse set of verification tools to provide verification of a logic design by the set of verification tools. The constraints and properties of the logic design are described in the HDL using one or more high-level assertion specification macros representative of the assertions of the logic design. The one or more assertion specification macros are stored as components within a specification macro library for later retrieval as needed. Upon reading original HDL source code containing assertion macro calls to the assertion specification macros, a specification macro processor accesses the definitions of the assertion macros stored, if contained within a definition library, and uses these definitions as templates to automatically write expansion HDL code into the HDL source code and to automatically store tool-specific HDL code into corresponding tool-specific modules libraries for later use by one or more verification tools. If definitions of one or more of the assertion macros are not contained with the definition library, they may be written as needed.

29 Claims, 4 Drawing Sheets

OTHER PUBLICATIONS

Donald Soderman et al., Implementing C Designs in Hardware: A Full–Featured ANSI C to RTL Verilog Compiler in Action, Verilog HDL Conference and VHDL International Users. Mar. 1998. Proceedings. pp. 22–29.*

S. Meguerdichian et al., Latency–Driven Design of Multi–Purpose Systems–On–Chip, Design Automation Conference, 2001. Proceedings., pp. 27–30, Jun. 2001.*

F. Mora et al., Design of a High Performance PCI Interface for an SCI network, Computing & Control Engineering Journal, pp. 275–282, Dec. 1998.*

A Fauth et al., Automated Generation of DSP Program Development Tools Using A Machine Description Formalism, Acoustics, Speech, and Signal Processing, pp. 457–460, Apr. 1993.*

S. Pees et al., Retargetable Compiled Simulation of Embedded Provessors Using a Machine Description Language, ACM Transactions on Design Automation of Electronic Systems, pp. 815–834, Oct. 2000.*

A Fauth et al., Describing Instruction Set Processors using nML, European Design and Test Conference, pp. 503–507, Sep. 1995.*

M. Hartoog et al., Generation of Software Tools from Processor Descriptions for Hardware/Software Codesign, Proceedings of Design Automation Conference, pp. 303–306, Jun. 1997.*

V. Ziyojanoyic et al., Compiled HW/SW Co–Simulation, Proceedings of the 33$^{rd}$ Annul Conference on Design Automation, pp. 690–695, Jun. 1996.*

R. Leupers et al., Generation of Interpretive and Compiled Instruction Set Simulators, Proceedings of ASP–DAC '99, pp. 339–342, Jan. 1999.*

R. Leupers et al., Retargetable Generation of Code Selectors from HDL Processor Models, Proceeding of European Design and Test Conference, pp. 140–144, Mar. 1997.*

Lionel Bening, Harry Foster, Principles of Verifiable RTL Design: A Functional Coding Style Supporting Verification Processes in Verilog, Kluwer Academic Publishers, 272 pages, Feb. 2000.*

Bening et al., Optimizing Multiple EDA Tools Within the ASIC Design Flow, IEEE Design & Test of Computers, pp. 46–55, Jul. 2001.*

Originally published as an article by Waite, W. M. "A Language–Independent Macro Processor," in Communications of the ACM, vol. 10, No. 10, Oct. 1967. Downloaded Dec. 2, 2002 from website: <http://members.shaw.ca/parz/doc/TheMLIMacroProcessor.html>.

Kernighan, Brian W. and Ritchie, Dennis M., Prentice Hall Software Series, The C Programming Language. Bell Telephone Laboratories, Inc. 1988, Apendix A, pp. 228–233.

IEEE Std. 1076–1993, IEEE Standard VHDL Language Reference Manual, Jun. 6, 1994, Section 8.2—"Assertion Statement", pp. 113/114 and Section 8.3—"Report Statement", pp. 114/115.

IEEE Std. 1364–1995, IEEE Standard Hardware Description Language Based on The Verilog Hardware Description Language, Oct. 14, 1999.

Kenneth L. McMillan, Symbolic Model Checking, 1993, pp. 11–24.

Edmund M. Clarke, Jr., Orna Grumberg, and Doron A. Peled, Model Checking, Chapters 3–6, pp. 27–95.

* cited by examiner

SYSTEM AND METHOD FOR SPECIFYING HARDWARE DESCRIPTION LANGUAGE ASSERTIONS TARGETING A DIVERSE SET OF VERIFICATION TOOLS

FIELD OF THE INVENTION

The presented invention relates generally to the use of hardware description languages to specify circuit logic design in a format that is acceptable to logic synthesis tools, and, more particularly, to a system and method for unifying the specification of design constraints and properties using a hardware description language (HDL) independent assertion format.

BACKGROUND OF THE INVENTION

Hardware logic design is preferably tested prior to manufacture. The objective of design verification is to ensure that a design's implementation satisfies the requirements of its specification. Design analysis enables the design engineer to uncover errors at a point of the design phase where they will still be relatively inexpensive to fix. In order to make verification and analysis of logic design economically feasible, it is desirable to dramatically reduce the cost of design specification and automate the analysis process.

Design engineers traditionally verify their design using a black-box testing approach in which the engineer will first create a model of the design written in a hardware description language (HDL), such as Verilog [IEEE 1364–1995] or VHDL [IEEE 1076–1993]; the design model is often referred to as the device-under-test (DUT) in a verification process. The engineer will then create a model of the design environment, referred to as a testbench, which will include or instantiate a copy of the DUT. The testbench is responsible for driving stimulus, i.e., logical one and zero values, into the DUT. In addition, the testbench provides the means for observing and validating the output response values from the DUT. The specification defines the values or sequences of values permitted by the DUT.

One problem with using a black-box testing approach to validate proper design behavior is that it is limited to observing output ports of the DUT. The DUT might exhibit improper internal behavior, such as if a state machine violates its one-hot property (meaning that only one bit is actively high after a reset), but still have proper output response values because the design error is not directly observable on the output ports. This might be due to the current set of input stimulus, when applied to the DUT, impeding the internal problem from propagating to an output port. Given a different set of input stimulus the internal error might be observable. Hence, validating all internal properties of a design using black-box testing techniques is often impractical, particularly as design size increases.

White-box testing is an alternative technique for validating properties of a design. This technique creates test monitors and checkers on internal points within the DUT, resulting in an increase in observable behavior during testing. The previous assertion that a state machine within the DUT is always one-hot can be validated by adding an internal checker to directly monitor each register bit of the state machine. Thus, if the one-hot property is violated, the error is instantly isolated to the problem. This overcomes the problem of black-box testing possibly missing an internal error (for a given input stimuli) by only observing DUT output responses.

There currently exist several types of design verification and analysis tools for validating correct functional design intent. This set of tools includes logic simulation tools, testbench generation tools, formal verification tools, and semi-formal verification tools. Logic simulation tools are used to model and validate design behavior responses for a given set of input stimuli or test vectors; of course, the results obtained using logic simulation tools are only as good as the quality of the set of input stimuli used. Testbench generation tools are used to generate design input stimuli and specify events and assertions for validation in their proprietary languages. So-called formal tools include state-space exploration, static property checker and model checker tools that validate user-specified properties using static and formal techniques without test vectors. Formal tools are heavily proof driven and mathematical in approach. Semi-formal verification tools, such as amplification tools, combine traditional simulation techniques with formal state-space exploration and model checking techniques. The mathematical proofs of the formal tool approach are employed with a limited or bounded search at certain times during the verification process.

One way of specifying a design's functional intent, expressed by the properties of the design, is to create a set of design assertions representative of the logic design. As an example, consider that a possible design assertion is that a state machine's encoding is always "one-hot" after a reset, meaning that only one bit of a collection of bits is actively high at a time. If the state machine violates the one-hot assertion following a reset, then the logic design is flawed in some way.

In discussing design assertions, it is helpful to understand both verification events and design assertions. A verification event may be defined as an HDL expression, which evaluates to a TRUE value. For example, if the expression (c_ready==1 && c_reset!=1) evaluates TRUE, then an event has occurred in the verification environment. An assertion is defined as a property of a design, and may be classified as either static or temporal A static assertion is an event that must be TRUE for all time. A temporal assertion has a time relationship of events associated with it, whose correct sequence must be TRUE. For example, a temporal assertion can be viewed as an event-triggered window, bounding a specific property, i.e., an event.

Figure 1:
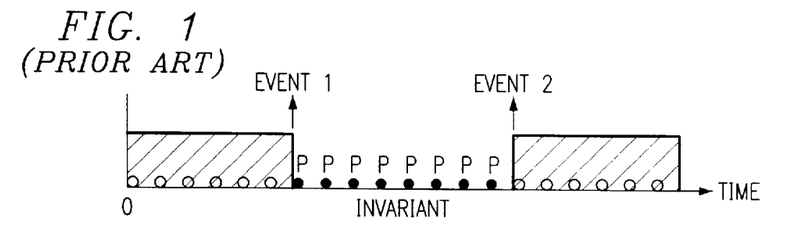
FIG. 1 illustrates an assertion for an invariant property.
Figure 2:
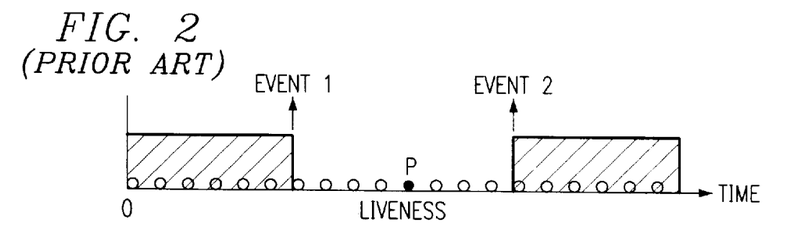
FIG. 2 illustrates an assertion for a liveness property.

The following examples illustrate aspects of both temporal and static assertions, and combinations thereof. FIG. 1 illustrates an assertion for an invariant property. The property (i.e., event P) in this example is always valid after Event 1 occurs, and continues to be to be TRUE until Event 2 occurs. FIG. 2 illustrates an assertion for a liveness property. The event P, in this example, must eventually be valid after the first event-trigger occurs and before the second event-trigger occurs. In this example, a property of the design is invalid if event P does not occur within the specified event-triggered window.

In addition to static and temporal, an assertion can also be classified as either a constraint or a property, depending upon where the assertion is made. A constraint may be thought of as a range of allowable values. An assertion made on an input port of the design model being verified, referred to as the DUT, is an example of a constraint because it bounds the input stimulus to permissible operating values for that particular input port. The DUT cannot be guaranteed to operate correctly if its input stimulus violates a specified constraint. A property may be thought of as expected behavior in response to defined stimuli (constraints). An assertion made on an output port of a DUT, or an internal point in the design, is an example of a property. For any permissible sequence of input values applied to the DUT, the properties of the design will not be violated if the design is functionally correct. It is noted that the term "property", as used herein, may be used to refer to a property assertion as well as a constraint assertion.

There are several techniques currently available for specifying the assertions, or properties, of a logic design. VHDL [IEEE 1076–1993] provides a language construct for specifying a static invariant assertion. For example:

assert event
      report message
         severity level

The assert statement can be used as an internal checker during the course of simulation; this is an example of white-box testing.

Unfortunately, VHDL does not provide any constructs for specifying temporal assertion or fiveness properties. In addition, with the exception of logic simulators, commercial verification tools such as property checkers, model checkers and semiformal verification tools will not use the VHDL static assertion construct during verification. In other words, these tools use their own proprietary language to specify a design assertion. Moreover, Verilog [IEEE 1364–1995] does not provide any language constructs for static, temporal, invariance or liveness assertions.

The following examples illustrate different methods currently available for capturing and validating the same design assertion, targeted at: Verilog logic simulation (Example 1), the SMV public-domain model checker [McMillan 1993] (Example 2), general commercial property checking tools (Example 3), and an automaton generation template (Example 4). The design assertion (or property) specified for these examples is that a specific queue in the design cannot underflow when the queue is in a valid state, i.e., when the queue_valid is active high.

EXAMPLE 1

Logic Simulation

For logic simulation, an HDL internal checker can be written to validate the assertion as shown in the following Verilog example:

module QueueSafe (ck, queue_valid, queue_underflow);
      always @(posedge ck) begin
         if (queue_valid==1'b1) begin
            if (!(queue_underflow==1'b0)) begin
               $display ("ERROR: QueueUnderflow");
               $finish;
            end
         end
      end
   endmodule During simulation, if the queue_underflow signal is ever activated when the queue is in a valid state, the QueueSafe module will display an error and stop simulation.

EXAMPLE 2

SMV Model Checker

Alternatively, the assertion could be specified as an embedded temporal property language, such as CTL, which stands for Computation Tree Logic [Clarke and Emerson 1981], in the HDL as a meta-comment, and then used by a public domain model checker such as symbolic model verifier (SMV) [McMillan 1993]. For example:

//assert: QueueSafe: AG((queue_valid==1))=>(queue_underflow!=1)

This CTL Verilog meta-comment expresses the same assertion or property of the design as is modeled with the Verilog QueueSafe module in Example 1.

EXAMPLE 3

Commercial Property Checkers

Many commercial tools have developed their own HDL assertion language, generally using meta-comments similar to the following convention:

//{vendor_name}:{vendor proprietary assertion language}

Thus, multiple meta-comments would be required when using multiple vendor verification tools.

EXAMPLE 4

Automaton Generation Template

U.S. Pat. No. 5,966,516, entitled, "Apparatus for defining properties in finitestate machines," describes a method for specifying system properties in a finite set of templates, which can generate computer-executable code (e.g., automata) intended to test the behavioral attributes of the system. A shortcoming of this approach is that it does not capture the properties of the design directly within the HDL. In addition, this method does not solve the problem of re-targeting the assertions (constraints and properties) to a diverse set of verification tools; each tool must use its own proprietary assertion specification languages.

As illustrated in Examples 1–4, the lack of formal language constructs for assertion specification in today's HDLs has caused a myriad of proprietary, commercial, tool-specific verification assertion languages to emerge. In order to express the same property of a design as an assertion for many different verification processes and tools, many different representations of the assertion are required. It is clear that there exists an unmet need in the art to be able to represent an assertion of a logic design model in a standardized way, regardless of what type of verification processes and/or tools are used.

BRIEF SUMMARY OF THE INVENTION

The present invention relates generally to hardware description languages to specify circuit logic design in a format that is acceptable to logic synthesis tools and methods therefore. Objects, advantages and features of the invention will become apparent to those skilled in the art upon consideration of the following detailed description of the invention.

In accordance with an exemplary embodiment, a method consistent with the invention of specifying hardware description language assertions targeting a diverse set of verification tools to provide verification of a logic design by the set of verification tools includes the following: specifying properties and constraints of the logic design in an input HDL code that defines a process for verifying the logic design; defining a plurality of assertion macros, representative of the properties and constraints of the logic design and called by a plurality of corresponding assertion macro calls within the input HDL code, in a plurality of macro definitions; a macro processor reading the input HDL code; in response to reading an assertion macro call in the input HDL code, the macro processor accessing a macro definition of the assertion macro corresponding to the assertion macro call, using the macro definition as a template to automatically generate a replacement HDL code, substituting the replacement HDL code for the assertion macro call in the input HDL code, and automatically placing a tool-specific HDL code definition section of the macro definition within a corresponding tool-specific modules library; and repeating this approach for each assertion macro call in the input HDL code to yield a tool-independent output HDL code capable of being executed by any tool of a plurality of tools anticipated to be available to verify the logic design. A similar method may be carried out for a single assertion macro.

The above, exemplary method, as well as other methods of the invention, may be embodied in a computer readable storage medium contains executable instructions which, when executed in a processing system, causes the system to specify hardware description language assertions targeting a diverse set of verification tools to provide verification of a logic design by the set of verification tools.

A system suitable for specifying hardware description language assertions targeting a diverse set of verification tools to provide verification of a logic design by the set of verification tools, consistent with embodiments of the invention, includes: a macro processor, a plurality of tool-specific module libraries, and a macro definition library. The macro processor is provided with an input hardware description language (HDL) code which defines a process for verifying the logic design and which contains a plurality of assertion macro calls corresponding to a plurality of assertion macros that are representative of properties and constraints of the logic design. The macro definition library stores a plurality of macro definitions that define the plurality of assertion macros. The plurality of tool-specific module libraries correspond to a plurality of tools anticipated to be available to verify the logic design. In response to reading an assertion macro call of the plurality of assertions macro calls in the input HDL code, the macro processor accesses a macro definition of a corresponding assertion macro of the plurality of assertion macros from the macro definition library and uses the macro definition as a template to automatically generate a replacement HDL code and substitute the replace HDL code for the assertion macro call and to automatically place a tool-specific HDL code definition section of the macro definition within a corresponding tool-specific modules library of the plurality of tool-specific modules libraries.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself, however, both as to organization and method of operation, together with objects and advantages thereof, may be best understood by reference to the following detailed description of the invention, which describes certain exemplary embodiments of the invention, taken in conjunction with the accompanying drawings in which:

DESCRIPTION OF THE INVENTION

While this invention is susceptible of embodiment in many different forms, there is shown in the drawings, and will herein be described in detail, specific embodiments, with the understanding that the present disclosure is to be considered as an example of the principles of the invention and not intended to limit the invention to the specific embodiments shown and described.

The system and method of the present invention utilize a general, tool-independent HDL assertion specification format and, in so doing, provide an approach that enables the logic design verification process to take advantage of diverse and dissimilar analysis tools and HDL languages. The details of a proprietary assertion language associated with a particular vendor's product, including the implementation details of the simulation assertion-checking model, are separated from the higher level description of design properties (assertions). The constraints and properties of the design are described in the HDL using one or more high-level assertion specification macros representative of the assertions of the design. The one or more assertion specification macros are stored as components within a specification macro library for later retrieval as needed. Upon reading original HDL source code containing assertion macro calls to the assertion specification macros, a specification macro processor accesses the definitions of the assertion macros stored within a definition library and uses these definitions as templates to automatically write expansion HDL code into the HDL source code and to automatically store tool-specific HDL code into corresponding tool-specific modules libraries for later use by one or more verification tools.

It is anticipated that the assertions of a particular logic design to be verified by one or more verification tools, represented by the assertion specification macros contained within original, input HDL source code, will be of either a concurrent assertion specification macro class or a procedural assertion specification macro class. The concurrent assertion specification macro, recognized by the identifier "_C" occurring at the end of the macro name, is instantiated as a concurrent checker in the HDL source code. The following is an example of a name of a concurrent assertion specification macro:

ASSERT_ALWAYS_C (ck, c_foo<c_bar);

A concurrent assertion in a verification program is continuously validated concurrently with other processes in the verification environment.

The procedural assertion specification macro is identified by the "_P" identifier occurring at the end of the macro name. The procedural assertion specification macro is not a free-standing macro like the concurrent assertion specification macro, but is instead embedded within an HDL procedural block. Procedural assertion specification macros are used to validate proper behavior as they are encountered within the procedural code block in which they reside. For instance, consider the procedural assertion specification macro, ASSERT_ALWAYS_P((idx>=5'b00000) && (idx<5'b10000));, which is embedded within the following HDL procedural block of code:

```
always ( . . . );
begin
    if (mem_rd) begin
        // Validate array address 0 thru 15
        ASSERT_ALWAYS_P ((idx>=5'b00000) &&
            (idx<5'b10000));
        c_mem=mem[idx];
    end
end
```

The use of a Verilog case or if statement can be used to control the activation of a procedural assertion. In the above example, a Verilog if statement is used to control the ASSERT_ALWAYS_P ((idx>=5'b00000) && (idx<5'b10000)); procedural assertion specification macro.

As will be discussed in more detail, a number of macro definitions, representative of assertion specification macros likely to be used within the original, input HDL source code having assertion specification macro (SMAC) calls, will be predefined and stored within SMAC Definition Libraries for reference when a SMAC call within the input HDL source code is encountered by the specification macro processor. When the SMAC call is encountered at some future time, the macro processor can readily write expansion code suitable for use by various tools to SMAC Modules Libraries that are representative of the various tools. The number and type of assertion specification macros needed will, of course, be determined by the type of logic design assertions and properties to be tested. Following are some examples of the types of assertions that might be tested in a logic design In each of the following assertion examples, a set of HDL expressions or variables are passed in as arguments and reformatted into an appropriate assertion language depending upon the verification process that is targeted:

ASSERT_ALWAYS_C ([ck], [hdl_expr]);—An invariant concurrent assertion to ensure that its argument always evaluates TRUE. This assertion will continuously monitor the hdl_expr. It contends that some Verilog expression will always evaluate TRUE. Whenever hdl_expr evaluates to FALSE, an assertion will fire (i.e., an error condition will be detected in the HDL code). The hdl_expr can be either a valid HDL variable—or any valid HDL expression. The [ck] argument is a valid clock variable in the HDL.

ASSERT_ALWAYS_P ([hdl_expr]);—An invariant procedural assertion to ensure that its argument, i.e., hdl_expr, always evaluates TRUE.

ASSERT_ARBITER_C ([ck], [hdl_expr]);—A concurrent assertion to ensure proper request/grant pair sequencing.

ASSERT_CONSTANT_C ([ck], [hdl_expr]);—A concurrent assertion to ensure that its argument never changes values.

ASSERT_EVENTUALLY_C ([ck], [hdl_expr]) —A concurrent assertion to ensure proper sequences of events.

ASSERT_NEVER_C ([ck], [hdl_expr]);—An invariant concurrent assertion to ensure that its argument never evaluates TRUE.

ASSERT_NEVER_P ([hdl_expr]);—An invariant procedural assertion to ensure that its argument never evaluates TRUE.

ASSERT_ODD_PARITY_C ([ck], [hdl_expr]);—A concurrent assertion to ensure that its argument has an odd number of bits asserted.

ASSERT_ODD_PARTY_P ([hdl_expr]);—A procedural assertion to ensure that its argument has an odd number of bits asserted.

ASSERT_ONE_HOT_C ([ck], [hdl_expr]);—A concurrent assertion to ensure that its argument has exactly one bit asserted.

ASSERT_ONE_HOT_P ([hdl_expr]);—A procedural assertion to ensure that its argument has exactly one bit asserted.

ASSERT_QUEUE_C ([ck], [hdl_expr]);—A concurrent assertion to ensure proper queue/FIFO behavior.

ASSERT_RANGE_C ([ck], [hdl_expr]);—A concurrent assertion to ensure values are within a permissible min/max range.

ASSERT_RANGE_P ([hdl_expr]);—A procedural assertion to ensure values are within a permissible min/max range.

The above, exemplary assertions are presented for purposes of example. One of ordinary skill in the art will recognize that assertions, combination of assertions may be employed without departing from the spirit and scope of the invention.

Figure 3:
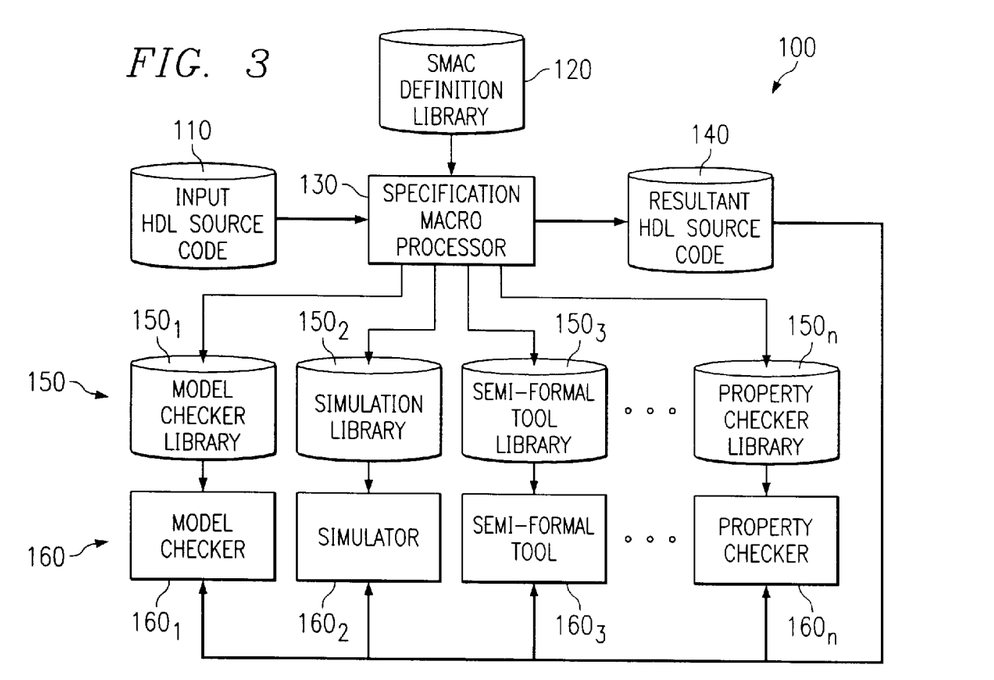
FIG. 3 illustrates a system diagram, in accordance with the present invention.

A system diagram 100 suitable for implementation of the design verification approach of the present invention is illustrated in FIG. 3. System diagram 100 contains the following components: HDL source code with assertion specification macro (SMACs) calls 110, a SMAC definition library 120, specification macro processor 130, resultant HDL source code 140, tool-specific SMAC Modules Libraries 150, and Tools 160. In the exemplary embodiment shown in FIG. 3, a single SMAC definition library 120 is shown. One of ordinary skill in the art will recognize that there may be multiple SMAC definition libraries $120_1 \ldots _n$, each containing assertion macro definitions, without departing from the spirit and scope of the invention. It is understood that the incoming HDL source code 110 and the resultant HDL source code 140 may each be contained within one or more source files. Model checker library MC LIB $150_1$ contains the assertion descriptions suitable for use by a model checker verification tool. Simulation library SIM LIB $150_2$ contains the same set of module assertions, but represented in a format useful for a logic simulation verification tool. Semi-formal library SF LIB $150_3$ and Property checker library PC LIB $150_n$ also contain the same set of assertions in a format that can be readily used by a Semi-formal verification tool and a Property checker verification tool, respectively. Tool-specific SMAC Modules Libraries $150_1 \ldots _n$ are the libraries that can be accessed and used by Model Checker Tool $160_1$, Simulator Tool $160_2$, Semi-Formal Tool $160_3$, and Property Checker Tool $160_n$, respectively, as indicated in the drawing.

The verification design written by a design engineer is provided to specification macro processor 130 as HDL source code having SMAC calls. The ability of the specification macro processor 130 to accept and properly process HDL source code with generic SMAC calls relieves the design engineer from having to be aware of the coding requirements of various types of tools. As will be described, the specification macro processor 130 reads the incoming HDL source code with SMAC calls 110 and, in accordance with SMAC definition library 120, and replaces an occurrence of a SMAC call in the HDL code with an HDL code fragment, contained within the SMAC Definition Library 120, to obtain the resultant HDL source code 140. The HDL code fragment may itself contain a call to a module contained within tool-specific module libraries 150$_{1 \ldots n}$. When the resultant HDL source code 140 is run by a verification tool 160, that tool, in response to module calls encountered within the resultant HDL source code 140, will access its corresponding library 150 to expand the module calls into the source code necessary to implement the verification.

Figure 4:
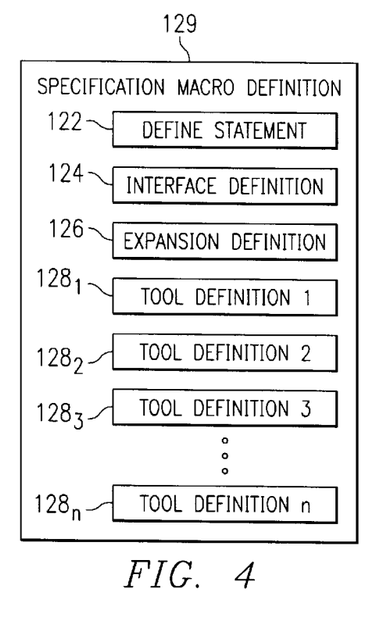
FIG. 4 illustrates a specification macro definition, in accordance with the present invention.
Figure 5:
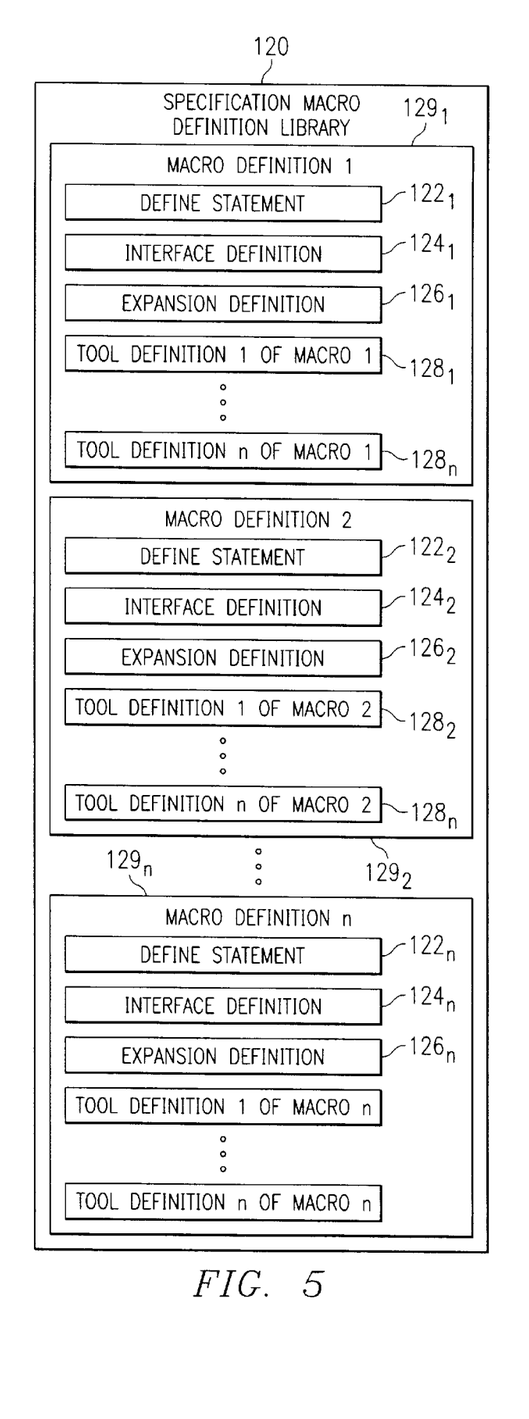
FIG. 5 illustrates an exemplary specification macro definition library, in accordance with the present invention.

SMAC definition library 120 contains a number of macro definitions 129, each having a Define statement 122 and a set of templates (124, 126, 128) that tell the specification macro processor 130 how to write the tool-specific SMAC Modules Libraries 150 and also how to expand the incoming HDL source file with SMAC calls 110 into the resultant HDL source code with expanded SMACs 140. Generally speaking, there will be a macro definition 129, with its attendant code sections, for each predefined macro within macro definition library 120. As illustrated in FIG. 4, a macro definition 129 within the SMAC definition library 120 contains several definition sections, including Define Statement 122, Interface definition section 124, Expansion definition section 126, and Tool-specific definition sections 128$_{1 \ldots n}$, which together define a given macro. Each of the tool definition sections 128$_{1 \ldots n}$ represent the tool-specific HDL code that will be needed by the corresponding Tools 160. In the particular implementation of FIG. 3 in which four possible Tools 160 are shown, for example, each macro definition may have four corresponding tool-specific definitions sections 128. As shown in FIG. 5, there can be, and often will be, multiple macro definitions 129 within SMAC definition library 120. Each of these macro definitions 129 will have one or more tool definition sections 128$_{1 \ldots n}$ containing the fragments of HDL code necessary for a corresponding Tool 160.

The Define Statement 122 sets forth the specification macro name and arguments to be defined. The Interface definition section 124 of the macro definition 129 defines the interface code that is placed within a Module Interface section 152 of the corresponding tool-specific modules library 150, if not already there, when the assertion specification macro is encountered in the input HDL code 110 by the macro specification processor 130. The Expansion definition section 126 contains the definition of how the SMAC macro call encountered within the incoming HDL code 110 is expanded to produce the resulting HDL code 140.

Tool-specific definition sections 128$_{1 \ldots n}$ will each contain tool-specific HDL code that will be placed within Module definition section 154 of a corresponding tool-specific SMAC Modules Library 150 and used by the corresponding Tool when it executes the resultant HDL code 140. The HDL expression or variables contained within the assertion macro call are passed in as arguments and reformatted into an appropriate assertion in tool-specific HDL code language. Tool-specific definition section 128 may have an identifier of some sort, such as a keyword, that will indicate which corresponding tool-specific SMAC Modules Library 150 to write the tool-specific HDL code to; keywords are discussed further in conjunction with the example of FIG. 8 below. The tool-specific HDL code contained within Tool-specific definition section 128 may in turn contain its own call to a module. It is noted that the order in which the Interface definition section 124, Expansion definition section 126, and Tool-definition definition sections 128$_{1 \ldots n}$ occur within definition 129 may be changed as desired without departing from the spirit and scope of the invention The following examples illustrate the use of the predefined tool-specific HDL code that can be written and stored to a tool-specific definition section 128. Reconsider the following concurrent assertion specification macro:

ASSERT_ALWAYS_C (ck, c_foo<c_bar);

If this assertion macro is targeted for a Verilog simulator, the concurrent assertion could be expanded into the following Verilog-specific HDL code, which can be stored within the Verilog SMAC Definition Library:

```
//rtl_synthesis translate_off
'ifdef ASSERTIONS_ON
    always @ (posedge ck)
        if('TEST_BENCH.dv_enable_assert)
            if (c_foo<c_bar) begin
                $display ("ASSERT ERR LINE 10");
                $finish;
            end
'endif
//rtl_synthesis translate_on
```

Because this tool-specific HDL code is stored within a tool-specific definition section 128, the details of the expanded specification macro are not important and may, in fact, change throughout the life of a project without affecting the designer's original or input HDL source code.

Suppose that, alternatively, the ASSERT_ALWAYS_C specification macro can be expanded into a CTL expression targeting the SMV model checker. The SMV model checker-specific HDL code that can be generated and stored within a model checker-specific definition section of SMAC Definition Library 120 might be:

//assert: Line_10 AG(c_foo<c_bar);

Again, the details of this code are not important since the designer is shielded from having to know the specific code requirements for the various verification tools. In general, the concurrent specification macro can now be expanded to support any existing commercial design verification tool (or any future tool) without having to disturb the design engineer's original HDL and assertions used to specify the designer's functional intent.

Consider now the expansion of the following procedural assertion specification macro, ASSERT_ALWAYS_P ((idx>=5'b00000) && (idx<5'b10000)); into tool-specific HDL code suitable for storage within a tool-specific definition section 128:

```
always ( . . . );
begin
    if (mem_rd) begin
        // Validate array address 0 thru 15
        ASSERT_ALWAYS_P ((idx>=5'b00000) &&
            (idx<5'b10000));
        c_mem=mem[idx];
    end
end
```

This procedural specification macro asserts that the index signal within an array address is bounded within the legal range 0 to 15. Note that the check is only made if mem_rd is valid. The procedural assertion will be expanded to the following HDL code when the verification tool is a Verilog simulator:

```
always ( . . . );
begin
    if (mem_rd) begin
        //rtl_synthesis translate_off
        'ifdef ASSERTIONS_ON
            if('TEST_BENCH.dv_enable_assert) begin
                // Validate array address 0 thru 15
                if ((idx>=5'b00000) && (idx<5'b10000)) begin
```

```
        $display ("ASSERT ERR LINE 15");
        $finish;
    end
end
//rtl_synthesis translate_on
    c_mem=mem[idx];
end
end
```

Figure 6:
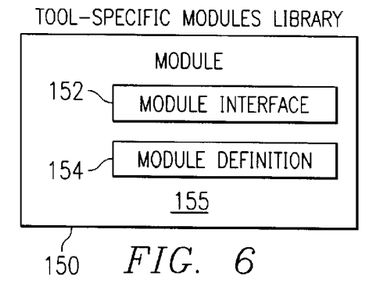
FIG. 6 illustrates a tool-specific modules library, in accordance with the present invention.
Figure 7:
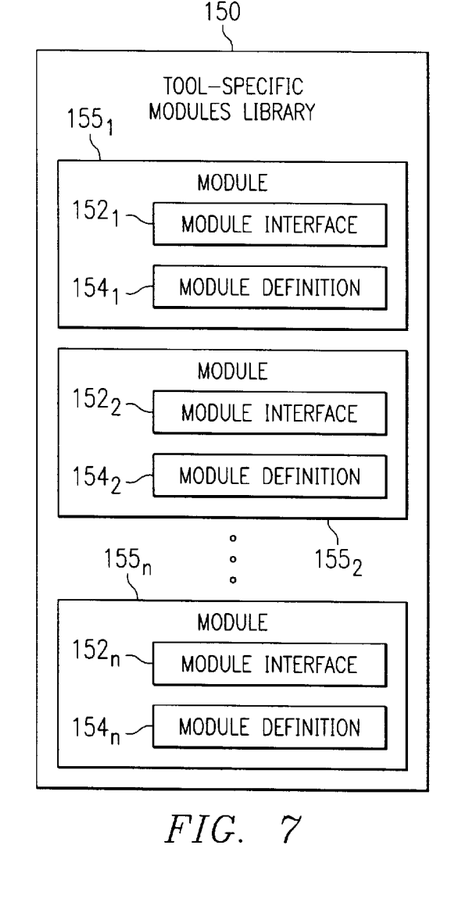
FIG. 7 illustrates a tool-specific modules library, also in accordance with the present invention.

Each SMAC Modules Library 150 contains the modules specific to a certain verification tool 160 and is illustrated in FIG. 6. It is written and updated by the specification macro processor 130 in accordance with the contents of its corresponding SMAC definition library 120 and may contain tool-specific HDL code to be used by a specific tool; the tool-specific HDL code of Module definition section 154 of Module 155 is predefined in the corresponding tool-specific definition section 128 of the SMAC definition library 120, as discussed above. The Module Interface section 152 of Module 155 is provided, if not yet defined, when the macro specification processor encounters the macro call within the input HDL code 110. Referring to FIG. 7, it can be seen that a typical tool-specific SMAC Modules Library 150 will typically have many modules $155_{1...n}$, each module 155 having a module interface section 152 and a Module definition section 154.

Figure 8:
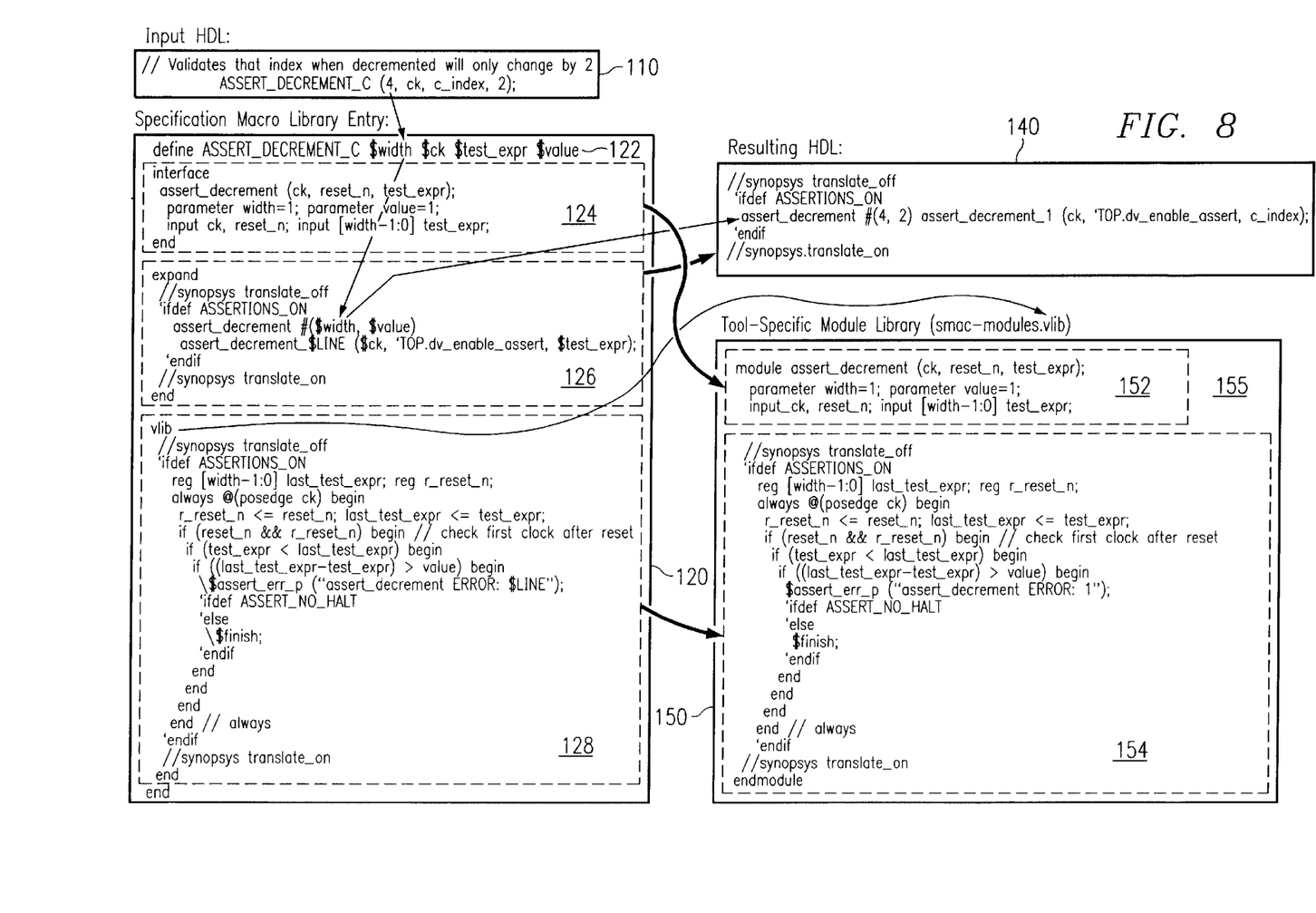
FIG. 8 is a block diagram that illustrates the interrelationship between various components of the system, in accordance with the present invention.

The interrelationship between the incoming HDL source code with SMAC calls 110, the SMAC definition library 120, the resultant HDL source code 140, and the specification macro processor 130 may be further understood by reference to the concurrent decrement assertion example of FIG. 8. The functionalities represented by the arrowed lines in FIG. 8 are controlled by the specification macro processor 130. In this example, the heavy black, curved arrowed lines illustrate how the different sections of the ASSERT_DECREMENT_C macro definition within the SMAC definition library 120 are split into the result HDL code 140 (an HDL code fragment, with a module call, in this instance) and the Module definition section 154 of Module 155 of the tool-specific SMAC Modules Library. The straight gray arrowed lines indicate how a macro parameter finds its way into the resulting HDL code 140. The curved gray arrowed lines illustrates how the tool-specific keyword "vlib" indicates to which tool-specific SMAC Modules Library 150 the specification macro processor 130 is to write the tool-specific definition section 128. It is understood that the tool-specific definition section 128 corresponding to another SMAC Modules Library 150 of another tool would have a different keyword indicating that the specification macro processor 130 is to write the contents of the tool-specific definition section 128 to that SMAC Modules Library 150.

Input HDL code 110 contains the macro call of the decrement assertion macro ASSERT_DECREMENT_C (4, ck, c_index, 2);. When the specification macro processor 130 encounters input HDL code 110, containing the macro call for the ASSERT_DECREMENT_C macro, specification macro processor consults with the SMAC definition library 120. The Interface, Expansion, and Tool-specific definition sections 124, 126, and $128_{1...n}$, respectively, of the library provide a template that can be used to write the resultant HDL source code with expanded SMACs 140 and SMAC Modules Library 150 as shown. In this example, the effect of reading an SMAC macro call upon the resulting HDL and tool-specific SMAL Modules Library 150 is only shown for one specific tool. Encountering the ASSERT_DECREMENT_C macro call within the incoming HDL code 110 will cause a similar operation to be effected on the tool-specific definitions sections 128 of SMAC definition library 120 and on SMAC modules library 150 associated with each pre-defined tool. If the HDL code contains an SMAC call that is not defined within the SMAC Modules Library 150 and is thus not recognized, then a macro definition 129 can be written as needed and stored to the SMAC Definition Library 120.

Figure 9:
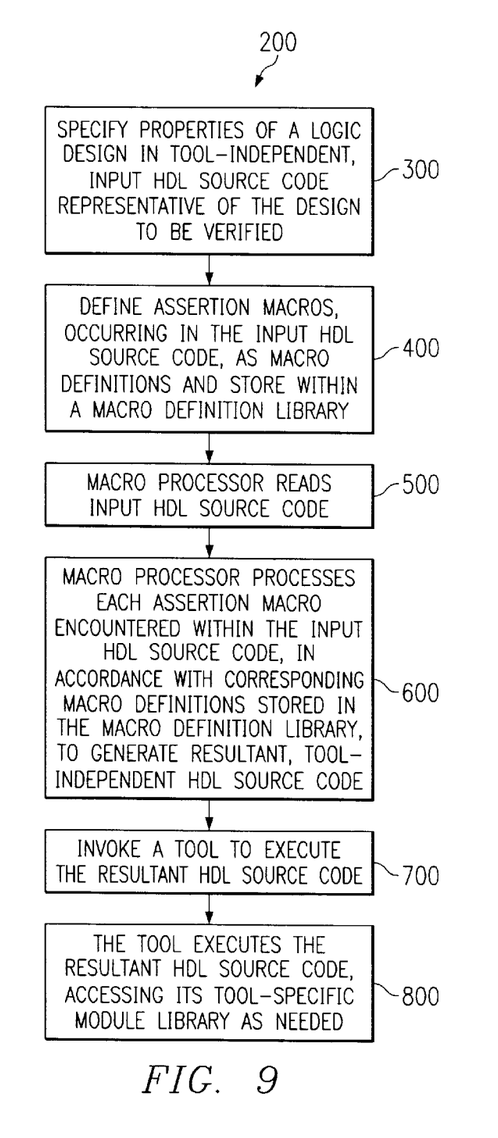
FIG. 9 is a flow chart that illustrates an overall methodology of the present invention.

The overall methodology of the present invention, described above, is further illustrated by reference to flowchart 200 of FIG. 9. Referring first to Block 300, the original, input tool-independent HDL source code containing SMAC calls 110, which is representative of design to be verified, is specified. At Block 400, the assertion macros called out in the input HDL source code, or assertion macros likely to be encountered, are defined as macro definitions 129 and stored in macro definition library 120, as described above. The order in which Blocks 300 and 400 are implemented may be reversed without departing from the spirit and scope of the invention. Following the definition stage of Block 400, the specification macro processor 130 reads the input HDL source code containing SMAC calls 110 at Block 500. At Block 600, the specification macro processor 130 processes each assertion macro as its macro call is encountered in the input source code 110 to automatically generate resultant HDL source code 140 suitable for execution by any number of verification tools. This processing is accomplished in accordance with the macro definition templates stored in the macro definition library and automatically generates the tool-specific definitions sections that will be needed for each verification tool during subsequent verification. At Block 700, a tool 160 is invoked to execute the expanded resultant HDL source code 140. The tool 160 will execute source code 140, accessing its tool-specific modules library 150 as needed at Block 800. The methodology of the present invention may be implemented by a programmed processor executing instructions stored on a computer-readable, electronic storage medium.

The system and method of the present invention allows a diverse and dissimilar set of analysis tools, and the assertion languages associated with those tools, to be used in the verification of a logic design, in a manner that does not require the verification code designer to be aware of the particular specification languages or specification details associated with the myriad tools of the tool set. The use of predefined assertion specification macros stored in definition libraries provide encapsulation of tool-specific HDL language details and thus allow the designer to write the verification code for a logic design at a high level of abstraction. The assertion specification macros are automatically expanded as needed by a specification macro processor into tool-dependent, HDL inline assertion language constructs.

While the invention has been described in conjunction with specific embodiment(s), it is evident that many alternatives, modifications, permutations and variations will become apparent to those of ordinary skill in the art in light of the foregoing description without departing from the spirit and scope of the invention. Accordingly, it is intended that the present invention embrace all such alternatives, modifications and variations as fall within the scope of the appended claims.

What is claimed is:

1. A method of specifying hardware description language assertions targeting a diverse set of verification tools to provide verification of a logic design by the set of verification tools, comprising:

a) specifying properties and constraints of the logic design in an input hardware description language (HDL) code that defines a process for verifying the logic design;

b) defining a plurality of assertion macros, which are representative of the properties and constraints of the logic design and called by a plurality of corresponding assertion macro calls within the input HDL code, in a plurality of macro definitions;

c) a macro processor reading the input HDL code;

d) in response to reading an assertion macro call in the input HDL code the macro processor accessing a macro definition of the assertion macro corresponding to the assertion macro call; and the macro processor using the macro definition as a template to automatically generate a replacement HDL code that is substituted for the assertion macro call in the input HDL code and to automatically place a tool-specific HDL code definition section of the macro definition within a corresponding tool-specific modules library; and e) repeating d) for each assertion macro call in the input HDL code to yield a tool-independent output HDL code capable of being executed by any tool of a plurality of tools anticipated to be available to verify the logic design.

2. The method of claim 1, further comprising:

storing the plurality of macro definitions in a macro definition library, wherein in response to reading the assertion macro call in the input HDL code the macro processor accesses the macro definition of the assertion macro corresponding to the assertion macro call from the macro definition library.

3. The method of claim 1, further comprising:

f) invoking a tool of the plurality of tools to execute the tool-independent output HDL code; and g) the tool executing the tool-independent output HDL code in order to verify the logic design, comprising:

g1) in response to reading an assertion macro in the tool-independent output HDL code, the tool accessing its corresponding tool-specific modules library to access the tool-specific HDL code definition section of the macro definition contained within a module definition section of the corresponding tool-specific modules library;

g2) the tool substituting the tool-specific HDL code definition section for the assertion macro in the tool-independent output HDL code to yield a run-time tool-dependent output HDL code; and g3) the tool executing the run-time tool-dependent output HDL code in order to verify the logic design.

4. The method of claim 1, wherein if the macro definition of the assertion macro is not accessible, further comprising writing the macro definition, wherein said macro definition comprises:

a define macro statement;

an interface section;

an expansion section; and one or more tool-specific definition sections, with each tool-specific definition section of the plurality of tool-specific definition sections containing tool-specific code corresponding to a different tool of a plurality of tools anticipated to be available to verify the logic design and with each tool-specific definition section capable of being identified as corresponding to its corresponding tool by the presence of a tool-specific identifier.

5. A computer readable storage medium containing executable instructions which, when executed in a processing system, causes the system to specify hardware description language assertions targeting a diverse set of verification tools to provide verification of a logic design by the set of verification tools, comprising:

a) specifying properties and constraints of the logic design in an input hardware description language (HDL) code that defines a process for verifying the logic design;

b) defining a plurality of assertion macros, which are representative of the properties and constraints of the logic design and called by a plurality of corresponding assertion macro calls within the input HDL code, in a plurality of macro definitions;

c) a macro processor reading the input HDL code;

d) in response to reading an assertion macro call in the input HDL code the macro processor accessing a macro definition of the assertion macro corresponding to the assertion macro call; and the macro processor using the macro definition as a template to automatically generate a replacement HDL code that is substituted for the assertion macro call in the input HDL code and to automatically place a tool-specific definition HDL code section of the macro definition within a corresponding tool-specific modules library; and e) repeating d) for each assertion macro call in the input HDL code to yield a tool-independent output HDL code capable of being executed by any tool of a plurality of tools anticipated to be available to verify the logic design.

6. The storage medium of claim 5, further comprising:

storing the plurality of macro definitions in a macro definition library, wherein in response to reading the assertion macro call in the input HDL code the macro processor accesses the macro definition of the assertion macro corresponding to the assertion macro call from the macro definition library.

7. The storage medium of claim 5, further comprising:

f) invoking a tool of the plurality of tools to execute the tool-independent output HDL code; and g) the tool executing the tool-independent output HDL code in order to verify to the logic design, comprising:

g1) in response to reading an assertion macro in the tool-independent output HDL code, the tool accessing its corresponding tool-specific modules library to access the tool-specific HDL code definition section of the macro definition contained within a module definition section of the corresponding tool-specific modules library;

g2) the tool substituting the tool-specific HDL code definition section for the assertion macro in the tool-independent output HDL code to yield a run-time tool-dependent output HDL code; and g3) the tool executing the run-time tool-dependent output HDL code in order to verify the logic design.

8. The storage medium of claim 5, wherein if the macro definition of the assertion macro is not accessible, further comprising writing the macro definition, wherein said macro definition comprises:

a define macro statement;

an interface section;

an expansion section; and one or more tool-specific definition sections, with each tool-specific definition section of the plurality of tool-specific definition sections containing tool-specific code corresponding to a different tool of a plurality of tools anticipated to be available to verify the logic design and with each tool-specific definition section capable of being identified as corresponding to its corresponding tool by the presence of a tool-specific identifier.

9. A method of specifying hardware description language assertions targeting a diverse set of verification tools to provide verification of a logic design by the set of verification tools, comprising:
   a) specifying properties and constraints of the logic design in an input hardware description language (HDL) code that defines a process for verifying the logic design;
   b) defining a plurality of assertion macros, which are representative of the properties and constraints of the logic design and called by a plurality of corresponding assertion macro calls within the input HDL code, in a plurality of macro definitions, wherein defining the plurality of assertion macros comprises:
      for each assertion macro of the plurality of assertion macros, writing a macro definition of an assertion macro that is representative of a property of a logic design, said macro definition comprising:
         a define macro statement;
         an interface section;
         an expansion section; and
         one or more tool-specific definition sections, with each tool-specific definition section of the plurality of tool-specific definition sections containing tool-specific code corresponding to a different tool of a plurality of tools anticipated to be available to verify the logic design and with each tool-specific definition section capable of being identified as corresponding to its corresponding tool by the presence of a tool-specific identifier;
   c) a macro processor reading the input HDL code having the plurality of assertion macro calls;
   d) in response to reading an assertion macro call of the input HDL code the macro processor calling a corresponding macro definition if the corresponding macro definition is accessible and writing the corresponding macro definition if the corresponding macro definition is not accessible;
      the macro processor processing the corresponding macro definition to access the interface section of the corresponding macro definition, the expansion section of the corresponding macro definition having an expansion HDL code, and the one or more tool-specific definition sections of the corresponding macro definition; and
      the macro processor substituting the expansion HDL code for the assertion macro call in the input HDL code, writing the interface section to a module interface section of a module of a corresponding tool-specific modules library, and writing the one or more tool-specific definition sections to one or more corresponding module definition sections of one or more corresponding tool-specific modules libraries; and
   e) repeating d) for each assertion macro call of the input HDL code to yield a tool-independent output HDL code capable of being executed by any tool of the plurality of tools.

10. The method of claim 9, further comprising:
   f) invoking a tool of the plurality of tools to execute the tool-independent output HDL code; and
   g) the tool executing the tool-independent output HDL code in order to verify the logic design, comprising:
      g1) in response to reading an assertion macro in the tool-independent output HDL code, the tool accessing its corresponding tool-specific modules library of the one or more tool-specific modules libraries to access the corresponding tool-specific definition section contained within a module definition section of the corresponding tool-specific modules library;
      g2) the tool substituting the corresponding tool-specific definition section for the assertion macro in the tool-independent output HDL code to yield a run-time tool-dependent output HDL code; and
      g3) the tool executing the run-time tool-dependent output HDL code in order to verify the logic design.

11. The method of claim 9, wherein each assertion macro of the plurality of assertion macros describes an assertion of the logic design and is one of a concurrent assertion macro and a procedural assertion macro, identified by an identifier element of each assertion macro.

12. The method of claim 11, wherein the concurrent assertion macro is instantiated as a concurrent checker in the HDL that concurrently validates the assertion of the concurrent assertion macro together with other properties of the logic design.

13. The method of claim 11, wherein the procedural assertion macro is embedded within a procedural block of the HDL and is activated as it is encountered in the HDL code.

14. The method of claim 9, wherein the corresponding tool-specific modules library is indicated by the tool-specific identifier of the tool-specific definition section.

15. A computer readable storage medium containing executable instructions which, when executed in a processing system, causes the system to specify hardware description language assertions targeting a diverse set of verification tools to provide verification of a logic design by the set of verification tools, comprising:
   a) specifying properties and constraints of the logic design in an input hardware description language (HDL) code that defines a process for verifying the logic design;
   b) defining a plurality of assertion macros, which are representative of the properties and constraints of the logic design and called by a plurality of corresponding assertion macro calls within the input HDL code, in a plurality of macro definitions, wherein defining the plurality of assertion macros comprises:
      for each assertion macro of the plurality of assertion macros, writing a macro definition of an assertion macro that is representative of a property of a logic design, said macro definition comprising:
         a define macro statement;
         an interface section;
         an expansion section; and
         one or more tool-specific definition sections, with each tool-specific definition section of the plurality of tool-specific definition sections containing tool-specific code corresponding to a different tool of a plurality of tools anticipated to be available to verify the logic design and with each tool-specific definition section capable of being identified as corresponding to its corresponding tool by the presence of a tool-specific identifier;
   c) a macro processor reading the input HDL code having the plurality of assertion macro calls;
   d) in response to reading an assertion macro call of the input HDL code:
      d1) the macro processor calling a corresponding macro definition if the corresponding macro definition is accessible;
      d2) if the corresponding macro definition is not accessible, writing the corresponding macro definition;

d3) the macro processor processing the corresponding macro definition to access the interface section of the corresponding macro definition, the expansion section of the corresponding macro definition having an expansion HDL code, and the one or more tool-specific definition sections of the corresponding macro definition; and d4) the macro processor substituting the expansion HDL code for the assertion macro call in the input HDL code, writing the interface section to a module interface section of a module of a corresponding tool-specific modules library, and writing the one or more tool-specific definition sections to one or more corresponding module definition sections of one or more corresponding tool-specific modules libraries; and e) repeating d) for each assertion macro call of the input HDL code to yield a tool-independent output HDL code capable of being executed by any tool of the plurality of tools.

16. The storage medium of claim 15, further comprising:

f) invoking a tool of the plurality of tools to execute the tool-independent output HDL code; and g) the tool executing the tool-independent output HDL code in order to verify the logic design, comprising:

g1) in response to reading an assertion macro in the tool-independent output HDL code, the tool accessing its corresponding tool-specific modules library of the one or more tool-specific modules libraries to access the corresponding tool-specific definition section contained within a module definition section of the corresponding tool-specific modules library;

g2) the tool substituting the corresponding tool-specific definition section for the assertion macro in the tool-independent output HDL code to yield a run-time tool-dependent output HDL code; and g3) the tool executing the run-time tool-dependent output HDL code in order to verify the logic design.

17. The storage medium of claim 15, wherein each assertion macro of the plurality of assertion macros describes an assertion of the logic design and is one of a concurrent assertion macro and a procedural assertion macro, identified by an identifier element of each assertion macro.

18. The storage medium of claim 17, wherein the concurrent assertion macro is instantiated as a concurrent checker in the HDL that concurrently validates the assertion of the concurrent assertion macro together with other properties of the logic design.

19. The storage medium of claim 17, wherein the procedural assertion macro is embedded within a procedural block of the HDL and is activated as it is encountered in the HDL code.

20. The storage medium of claim 15, wherein the corresponding tool-specific modules library is indicated by the tool-specific identifier of the tool-specific definition section.

21. A system suitable for specifying hardware description language assertions targeting a diverse set of verification tools to provide verification of a logic design by the set of verification tools, comprising:

a macro processor provided with an input hardware description language (HDL) code which defines a process for verifying the logic design and which contains a plurality of assertion macro calls corresponding to a plurality of assertion macros that are representative of properties and constraints of the logic design;

a macro definition library which stores a plurality of macro definitions that define the plurality of assertion macros; and a plurality of tool-specific module libraries that correspond to a plurality of tools anticipated to be available to verify the logic design wherein in response to reading an assertion macro call of the plurality of assertion macro calls in the input HDL code, the macro processor accesses a macro definition of a corresponding assertion macro of the plurality of assertion macros from the macro definition library and uses the macro definition as a template to automatically generate a replacement HDL code and substitute the replaced HDL code for the assertion macro call and to automatically place a tool-specific HDL code definition section of the macro definition within a corresponding tool-specific modules library of the plurality of tool-specific modules libraries.

22. The system of claim 21, wherein the macro processor operation in response to reading the assertion macro call is repeated for each assertion macro call of the plurality of assertion macro calls in the input HDL code to yield a tool-independent output HDL code capable of being executed by any tool of the plurality of tools.

23. The system of claim 22, further comprising:

the plurality of tools, wherein invoking a tool of the plurality of tools causes the tool to execute the tool-independent output HDL code.

24. The system of claim 23, wherein the tool, in response to reading one or more tool-independent assertion macros contained in the tool-independent output HDL code, accesses its corresponding tool-specific modules library to access tool-specific HDL code definition sections corresponding to the one or more tool-independent assertion macros, substitutes the tool-specific HDL code definition sections for the one or more tool-independent assertion macros to yield a run-time tool-dependent output HDL code, and executes the run-time tool-dependent output HDL code in order to verify the logic design.

25. The system of claim 24, wherein the tool-specific HDL code definition sections are contained within corresponding module definition sections of the corresponding tool-specific modules library.

26. The system of claim 21, wherein a macro definition of the plurality of macro definitions defines an assertion macro of the plurality of assertion macros and comprises:

a define macro statement;

an interface section;

an expansion section; and a plurality of tool-specific definition sections, with each tool-specific definition section of the plurality of tool-specific definition sections containing tool-specific code corresponding to a different tool of the plurality of tools and having a tool-specific identifier, and with each tool-specific definition section capable of being identified as corresponding to its corresponding tool by the presence of the tool-specific identifier.

27. The system of claim 26, wherein each assertion macro of the plurality of assertion macros describes an assertion of the logic design and is one of a concurrent assertion macro and a procedural assertion macro, identified by the tool-specific identifier of each assertion macro.

28. The system of claim 27, wherein the concurrent assertion macro is instantiated as a concurrent checker in the HDL code that concurrently validates the assertion of the concurrent assertion macro together with other properties of the logic design.

29. The system of claim 27, wherein the procedural assertion macro is embedded within a procedural block of the HDL code and is activated as it is encountered in the HDL code.

* * * * *